(12) United States Patent
Wang et al.

(10) Patent No.: US 11,723,173 B1
(45) Date of Patent: Aug. 8, 2023

(54) STACKED COLD PLATE WITH FLOW GUIDING VANES AND METHOD OF MANUFACTURING

(71) Applicant: Rolls-Royce Corporation, Indianapolis, IN (US)

(72) Inventors: Shuai Wang, Singapore (SG); Chandana J. Gajanayake, Singapore (SG); David R. Trawick, Indianapolis, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days.

(21) Appl. No.: 17/702,752

(22) Filed: Mar. 23, 2022

(51) Int. Cl.
  *F01D 25/12* (2006.01)
  *H05K 7/20* (2006.01)

(52) U.S. Cl.
  CPC ......... *H05K 7/20254* (2013.01); *F01D 25/12* (2013.01); *F05D 2220/70* (2013.01); *F05D 2260/213* (2013.01)

(58) Field of Classification Search
  CPC . F01D 25/12; H05K 7/20254; F05D 2220/70; F05D 2260/213
  See application file for complete search history.

(56) References Cited

U.S. PATENT DOCUMENTS

| | | |
|---|---|---|
| 2,640,329 A | 6/1953 | Ingvardsen |
| 5,353,865 A | 10/1994 | Adiutori et al. |
| 5,983,997 A | 11/1999 | Hou |
| 7,000,684 B2 | 2/2006 | Kenny et al. |
| 7,298,618 B2 | 11/2007 | Campbell et al. |
| 7,353,859 B2 | 4/2008 | Stevanovic et al. |
| 8,120,915 B2 * | 2/2012 | Pautsch ............... F28F 3/12 174/15.1 |
| 8,302,671 B2 * | 11/2012 | Sauer ............... F28F 1/00 165/80.4 |
| 8,305,755 B2 | 11/2012 | Dede |
| 8,427,832 B2 | 4/2013 | Dede et al. |
| 8,482,919 B2 | 7/2013 | Dede |
| 8,493,736 B2 * | 7/2013 | Oprins ............... H01L 23/4735 361/689 |
| 8,659,896 B2 | 2/2014 | Dede et al. |
| 8,792,239 B2 * | 7/2014 | Son ............... H01L 23/49575 361/689 |

(Continued)

FOREIGN PATENT DOCUMENTS

| | | |
|---|---|---|
| JP | 2018207017 | 12/2018 |
| JP | 6482954 | 3/2019 |

*Primary Examiner* — Igor Kershteyn
(74) *Attorney, Agent, or Firm* — Barnes & Thornburg LLP

(57) ABSTRACT

A cold plate assembly for cooling an electronic device includes a manifold, a comb insert, and a first vaned plate. The manifold is formed to define a cavity therein. The comb insert is located in the cavity includes channels defined by walls for receiving a fluid from passages in the manifold and transferring heat to the fluid. The first vaned plate includes a first panel and first channel vanes extending away from the first panel. The first vaned plate is removably coupled with the comb insert such that first channel vanes are located within the channels to guide the fluid. Each first channel vane extends from a wall toward a neighboring wall at an angle to direct the fluid to impinge upon the neighboring wall with increased velocity so as to increase the heat transfer between the neighboring wall and the fluid.

20 Claims, 11 Drawing Sheets

(56) References Cited

U.S. PATENT DOCUMENTS

| | | | |
|---|---|---|---|
| 8,982,558 B2* | 3/2015 | Beaupre | H01L 23/473 165/104.19 |
| 9,131,631 B2 | 9/2015 | Joshi | |
| 9,219,022 B2 | 12/2015 | Parida | |
| 9,230,726 B1 | 1/2016 | Parker et al. | |
| 9,252,069 B2* | 2/2016 | Bhunia | H01L 23/3735 |
| 9,445,526 B2 | 9/2016 | Zhou et al. | |
| 9,596,785 B2* | 3/2017 | Brand | F28F 3/12 |
| 9,622,380 B1 | 5/2017 | Joshi et al. | |
| 9,653,379 B2 | 5/2017 | Koyama et al. | |
| 9,693,487 B2* | 6/2017 | Choi | H05K 7/20918 |
| 9,980,415 B2* | 5/2018 | Zhou | H05K 7/20927 |
| 10,306,802 B1 | 5/2019 | Ditri et al. | |
| 10,566,265 B2 | 2/2020 | Fukuoka et al. | |
| 10,645,842 B2 | 5/2020 | Parida | |
| 10,665,530 B2 | 5/2020 | Chen et al. | |
| 10,903,141 B2 | 1/2021 | Malouin, Jr. | |
| 2002/0112847 A1* | 8/2002 | Nakahama | H01L 23/4735 165/104.11 |
| 2012/0097373 A1 | 4/2012 | Kandlikar | |
| 2019/0360759 A1 | 11/2019 | Collins et al. | |

* cited by examiner

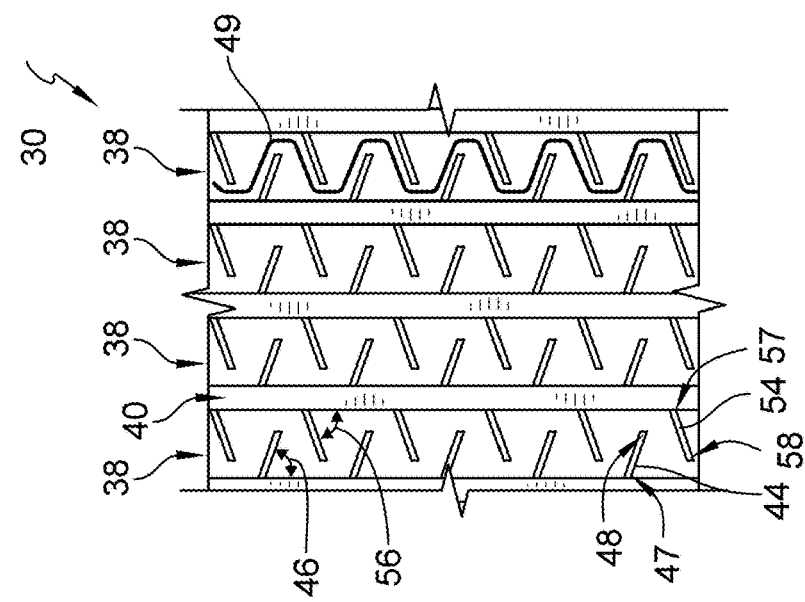
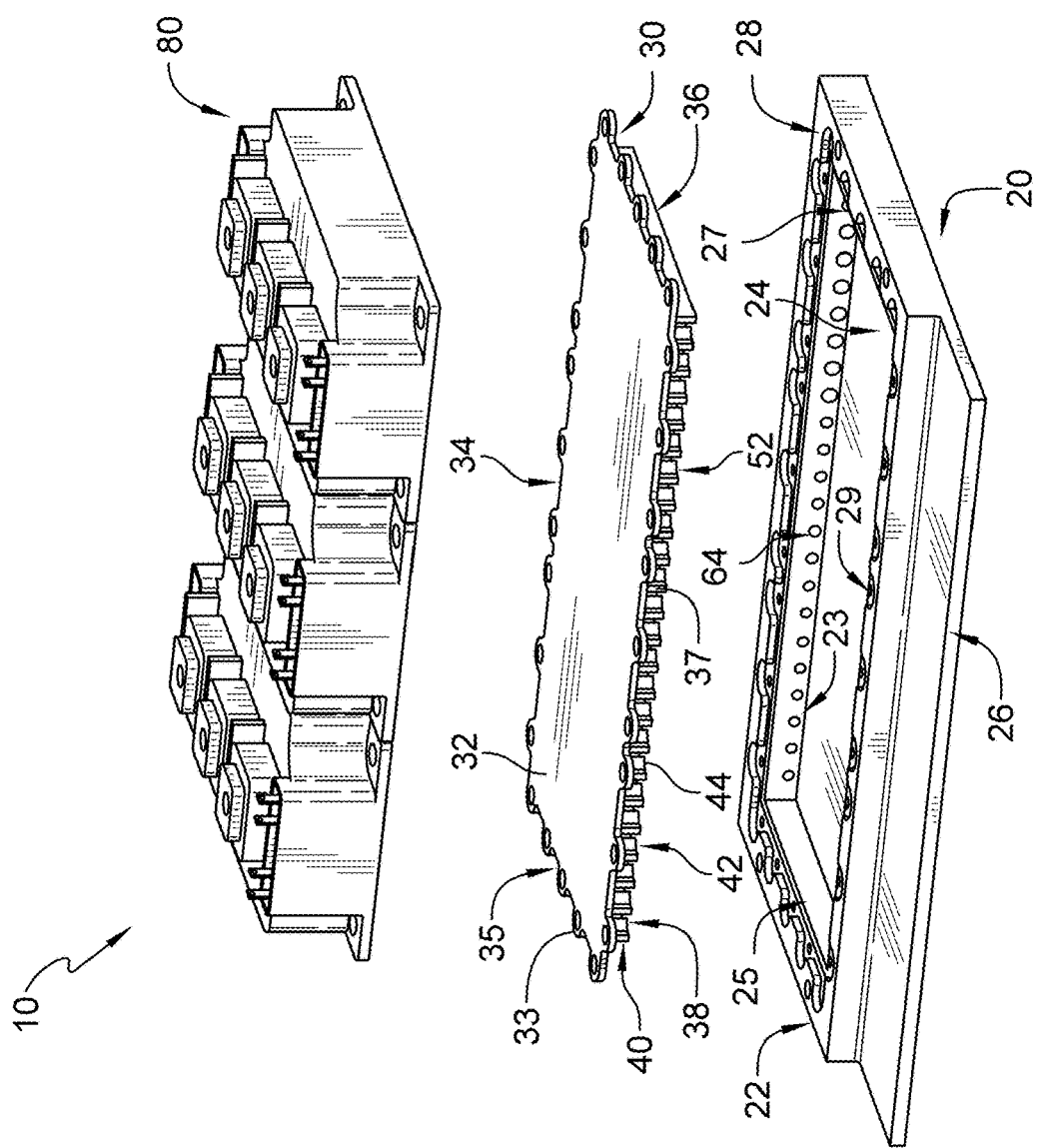

STACKED COLD PLATE WITH FLOW GUIDING VANES AND METHOD OF MANUFACTURING

FIELD OF THE DISCLOSURE

The present disclosure relates generally to propulsion systems, and more specifically to propulsion systems including electric propulsion components.

BACKGROUND

Gas turbine engines are used to power aircraft, watercraft, power generators, and the like. Additionally, propulsion units that produce thrust for aircraft, watercraft, power generators, and the like via electrically driven fans or propellers are being explored as alternatives for conventional, pure-combustion driven engines.

Gas turbine engines as well as electric engines may include a propulsion system having a multitude of electrical components. Cooling of these electrical components during use of operation of the engine is especially important. As such, cooling systems, in particular cooling plates, may be utilized to actively remove heat from the electrical components.

SUMMARY

The present disclosure may comprise one or more of the following features and combinations thereof.

According to the present disclosure, a cold plate assembly for cooling an electronic device includes a manifold, a comb insert, and a first vaned plate. The manifold is formed to define a cavity therein and a plurality of cooling passages that extend through the manifold and open into the cavity, and the comb insert is located in the cavity of the manifold and formed to include a plurality of channels for receiving a fluid from the plurality of cooling passages and transferring heat to the fluid. The comb insert includes a base panel and a plurality of comb walls protruding away from the base panel and extending from a first end of the base panel to a second end of the base panel opposite the first end to define the plurality of channels.

The first vaned plate includes a first panel and a plurality of first channel vanes extending away from the first panel, the first vaned plate being removably coupled with the comb insert such that the plurality of first channel vanes are located within the plurality of channels formed in the comb insert to guide the fluid through the plurality of channels, and each first channel vane of the plurality of first channel vanes extend from a first wall of the plurality of comb walls toward a second wall of the plurality of comb walls neighboring the first wall at a first angle to direct the fluid to impinge upon the second wall with increased velocity so as to increase the heat transfer between the second wall and the fluid.

In some embodiments, each first channel vane of the plurality of first channel vanes extends from a base end contacting the first wall of the plurality of comb walls to a terminal end opposite the base end, and the terminal end is spaced apart from the second wall of the plurality of comb walls so as to allow the fluid to flow between the terminal end and the second wall.

In some embodiments, the assembly further includes a second vaned plate including a second panel and a plurality of second channel vanes extending away from the second panel, the second vaned plate being removably coupled with the comb insert such that the plurality of second channel vanes are located within the plurality of channels formed in the comb insert to guide the fluid through the plurality of channels, and each second channel vane of the plurality of second channel vanes extend from the second wall of the plurality of comb walls toward the first wall of the plurality of comb walls at a second angle to direct the fluid to impinge upon the first wall with increased velocity so as to increase the heat transfer between the second wall and the fluid.

In some embodiments, each second channel of the plurality of second channel vanes extends from a base end contacting the second wall of the plurality of comb walls to a terminal end opposite the base end, and the terminal end is spaced apart from the first wall of the plurality of comb walls so as to allow the fluid to flow between the terminal end and the first wall.

In some embodiments, the second panel of the second vane plate is arranged on an underside surface of the first panel of the first vane plate, the first vane plate includes a plurality of openings through which the plurality of second channel vanes extend such that the plurality of first channel vanes and the plurality of second channel vanes are all arranged within the plurality of channels.

In some embodiments, each first channel vane and each second channel vane also extends from the first and second walls, respectively, toward the second end of the base panel, and the first angle and the second angle are in a range of 45 degrees to 85 degrees.

In some embodiments, the first angle is equal to the second angle.

In some embodiments, the plurality of cooling passages open into the cavity via a plurality of outlets, and the plurality of channels are each aligned with an outlet of the plurality of outlets in order to receive the fluid.

In some embodiments, the manifold includes a manifold body and a bottom plate, the cavity of the manifold is defined by four side walls of the manifold body and a top surface of the bottom plate, and the bottom plate is removably coupled to an underside of the manifold body and is configured to be removed from the manifold body so as to provide access to the first vaned plate, the second vaned plate, and the comb insert.

In some embodiments, the comb insert includes a plurality of coupling protrusions extending away from a perimeter of the base panel, and the plurality of coupling protrusions are arranged in corresponding coupling recesses formed in a top surface of the manifold body so as to couple the comb insert to the manifold.

In some embodiments, the assembly further includes a second comb insert located in the cavity of the manifold and formed to include a plurality of second channels for receiving a fluid from the plurality of cooling passages and transferring heat to the fluid, the second comb insert including a second base panel and a plurality of second comb walls protruding away from the base panel and extending from a first end of the second base panel to a second end of the second base panel opposite the first end to define the plurality of second channels.

In some embodiments, the assembly further includes a third vaned plate including a third panel and a plurality of third channel vanes extending away from the third panel, the third vaned plate being removably coupled with the second comb insert such that the plurality of third channel vanes are located within the plurality of second channels formed in the second comb insert to guide the fluid through the plurality of second channels, and each third channel vane of the plurality of third channel vanes extend from a third wall of the plurality of second comb walls toward a fourth wall of the plurality of second comb walls neighboring the first wall at a third angle to direct the fluid to impinge upon the fourth wall with increased velocity so as to increase the heat transfer between the fourth wall and the fluid.

In some embodiments, the assembly further includes a fourth vaned plate including a fourth panel and a plurality of fourth channel vanes extending away from the fourth panel, the fourth vaned plate being removably coupled with the second comb insert such that the plurality of fourth channel vanes are located within the plurality of second channels formed in the second comb insert to guide the fluid through the plurality of second channels, and each fourth channel vane of the plurality of fourth channel vanes extend from the fourth wall of the plurality of second comb walls toward the third wall of the plurality of second comb walls at a second angle to direct the fluid to impinge upon the third wall with increased velocity so as to increase the heat transfer between the third wall and the fluid.

According to a further aspect of the present disclosure, a cold plate assembly includes a manifold formed to define a cavity therein and a comb insert located in the cavity of the manifold and formed to include a plurality of channels for receiving a fluid, the comb insert including a plurality of comb walls defining the plurality of channels. The assembly further includes a first vaned plate including a first panel and a plurality of first channel vanes extending away from the first panel, the plurality of first channel vanes are located within the plurality of channels formed in the comb insert to guide the fluid through the plurality of channels, and each first channel vane of the plurality of first channel vanes extend from a first wall of the plurality of comb walls toward a second wall of the plurality of comb walls neighboring the first wall at a first angle to direct the fluid to impinge upon the second wall with increased velocity so as to increase the heat transfer between the second wall and the fluid.

In some embodiments, the first vaned plate is removably coupled with the comb insert.

In some embodiments, the assembly further includes a second vaned plate including a second panel and a plurality of second channel vanes extending away from the second panel, the second vaned plate being removably coupled with the comb insert such that the plurality of second channel vanes are located within the plurality of channels formed in the comb insert to guide the fluid through the plurality of channels, and each second channel vane of the plurality of second channel vanes extend from the second wall of the plurality of comb walls toward the first wall of the plurality of comb walls at a second angle to direct the fluid to impinge upon the first wall with increased velocity so as to increase the heat transfer between the second wall and the fluid.

In some embodiments, each first channel vane of the plurality of first channel vanes extend from a base end contacting the first wall of the plurality of comb walls to a terminal end opposite the base end, and the terminal end is spaced apart from the second wall of the plurality of comb walls so as to allow the fluid to flow between the terminal end and the second wall.

In some embodiments, each second channel vane of the plurality of second channel vanes extend from a base end contacting the second wall of the plurality of comb walls to a terminal end opposite the base end, and the terminal end is spaced apart from the first wall of the plurality of comb walls so as to allow the fluid to flow between the terminal end and the first wall.

In some embodiments, the first angle is equal to the second angle.

In some embodiments, the manifold includes a plurality of cooling passages extending through the manifold and open into the cavity, the plurality of channels of the comb insert receive the fluid from the plurality of cooling passages and transfer heat to the fluid, the manifold includes a manifold body and a bottom plate, the cavity of the manifold is defined by four side walls of the manifold body and a top surface of the bottom plate, and the bottom plate is removably coupled to an underside of the manifold body and is configured to be removed from the manifold body so as to provide access to the first vaned plate and the comb insert.

According to a further aspect of the present disclosure, a method includes forming a cavity within a manifold, forming a plurality of cooling passages within the manifold, the plurality of cooling passages opening into the cavity, arranging a comb insert in the cavity of the manifold, the comb insert including a plurality of channels for receiving a fluid from the plurality of cooling passages and transferring heat to the fluid, the comb insert including a base panel and a plurality of comb walls protruding away from the base panel and extending from a first end of the base panel to a second end of the base panel opposite the first end to define the plurality of channels, and removably coupling a first vaned plate with the comb insert such that a plurality of first channel vanes of the first vaned plate are located within the plurality of channels formed in the comb insert to guide the fluid through the plurality of channels, the first vaned plate including a first panel and the plurality of first channel vanes extending away from the first panel, each first channel vane of the plurality of first channel vanes extending from a first wall of the plurality of comb walls toward a second wall of the plurality of comb walls neighboring the first wall at a first angle to direct the fluid to impinge upon the second wall with increased velocity so as to increase the heat transfer between the second wall and the fluid.

These and other features of the present disclosure will become more apparent from the following description of the illustrative embodiments.

BRIEF DESCRIPTION OF THE DRAWINGS

FIG. 2A is a perspective view of a cold plate assembly according to the present disclosure showing a manifold, a comb insert including a plurality of channels defined by a plurality of walls and a plurality of channel vanes arranged within the channels, and heat sources arranged on top of the manifold and enclosing the comb insert within;

FIG. 2B is a top view of a section of the comb insert and the plurality of channel vanes of FIG. 2A, showing that a plurality of first channel vanes extend away from a first wall of the channel toward a second wall of the channel and a plurality of second channel vanes extend away from the second wall of the channel toward the first wall of the channel, showing that each vane has a space between a terminal end and the neighboring wall so as to allow fluid to flow around the terminal ends of each vane, and showing that the fluid is directed to impinge upon the walls with increased velocity so as to increase the heat transfer between the walls and the fluid;

FIG. 7B is a perspective view of a vane plate used in the cold plate assembly of FIG. 7A, showing that the plate includes openings through which walls of the corresponding comb insert may fit through;

DETAILED DESCRIPTION OF THE DRAWINGS

Figure 1:
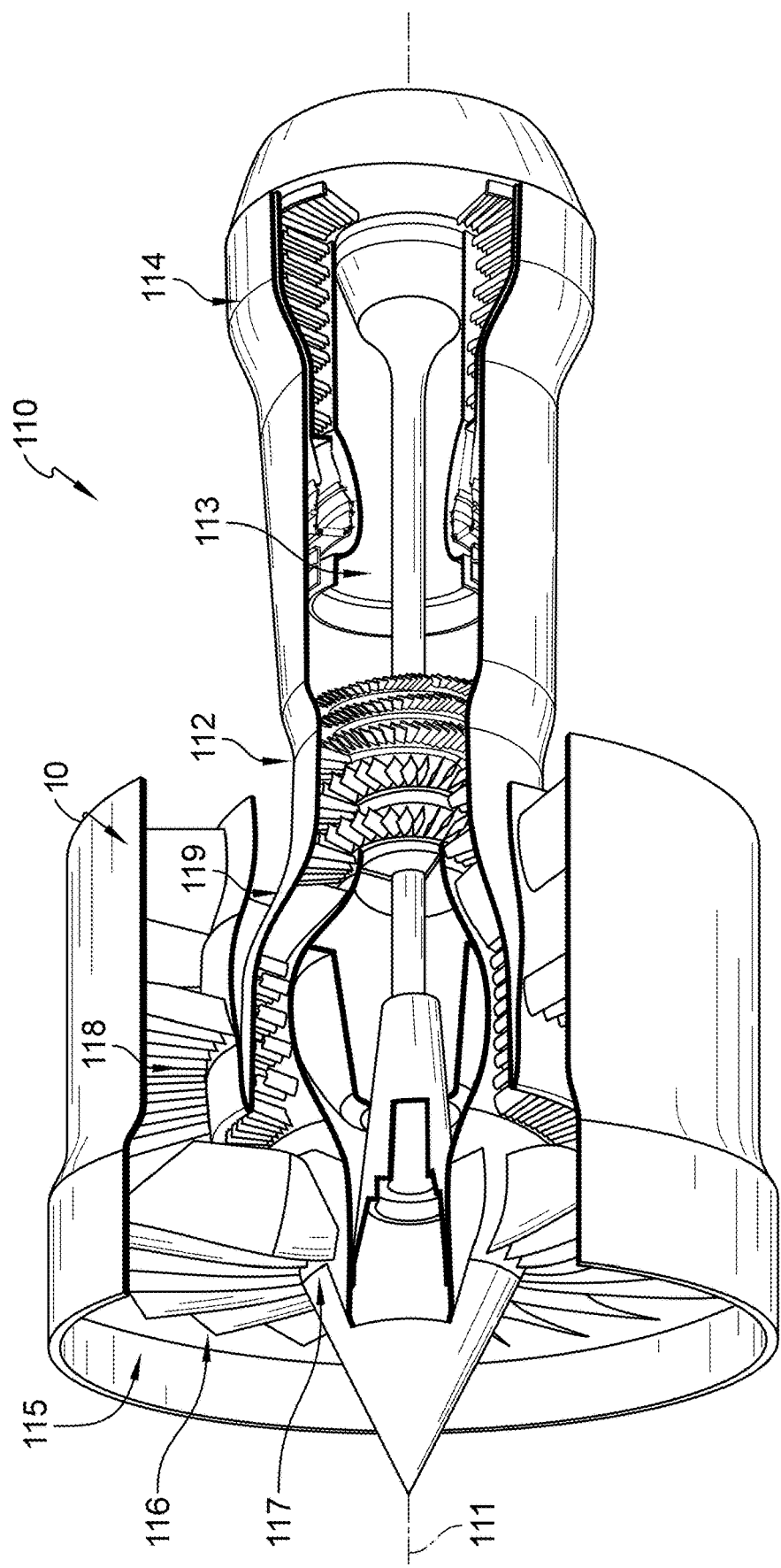
FIG. 1 is a cutaway view of an exemplary gas turbine engine in which a cold plate assembly according to the present disclosure may be arranged, the gas turbine engine including a fan assembly having an inlet fan having plurality of fan blades that extend radially outward relative to the central axis, an engine core having a compressor, a combustor, and a turbine.

For the purposes of promoting an understanding of the principles of the disclosure, reference will now be made to a number of illustrative embodiments illustrated in the drawings and specific language will be used to describe the same.

An illustrative aerospace gas turbine engine 110 includes an engine core having a compressor 112, a combustor 113, and a turbine 114, as shown in FIG. 1. The engine 110 further includes a fan assembly 116 having a plurality of fan blades 117 arranged in an inlet 115 of the engine 110 that is driven by the turbine 114 and provides thrust for propelling an air vehicle by forcing fan exit air through a fan duct 118 that circumferentially surrounds an outer casing 119 of the engine core. The compressor 112 compresses and delivers air to the combustor 113. The combustor 113 mixes fuel with the compressed air received from the compressor 112 and ignites the fuel. The hot, high-pressure products of the combustion reaction in the combustor 113 are directed into the turbine 114 to cause the turbine 114 to rotate about a central axis 111 and drive the compressor 112 and the fan 116. In some embodiments, the fan may be replaced with a propeller, drive shaft, or other suitable configuration.

A cooling system, in particular a cold plate assembly 10, is arranged within the engine 110 and configured to actively remove heat from at least one electrical component (not shown) within the engine 110. The cold plate assembly 10 of the illustrative embodiment includes a manifold 20, a comb insert 30, and a heat source 80. The cold plate assembly 10, in particular the comb insert 30 and its related components, is arranged in close proximity to the electrical component, which may be the heat source 80 shown in FIG. 2A, in order to receive heat from the electrical component, thus drawing heat away from the component.

In order to remove heat from the electrical component, the comb insert 30 receives heat from the electrical component, and in turn, transfers the heat to a cooling fluid 49 that is flowing through channels 38 formed in the comb insert 30. The cooling fluid 49 receives the heat transferred to it from the walls 40 of the channels 38 of the comb insert 30, and removes the heat from the comb insert 30 via cooling passages 62 formed in the manifold 20. In the illustrative embodiment, the channels 38 include a plurality of vanes 44, 54 arranged therein. The vanes 44, 54 direct the fluid 49 toward the walls 40 of the channels 38 at high angles such that the fluid 49 impinges upon the walls 40 with increased velocity so as to increase the heat transfer between the walls 40 and the fluid 49. In some embodiments, the cooling fluid 49 may be a water-glycol mixture.

In the illustrative embodiment, the manifold 20 includes a manifold body 22 and a bottom plate 26 as shown in FIG. 2A. The manifold body 22 may be formed as a rectangular shape having four sides, but other shapes may be utilized based on the cooling and design requirements of the assembly. The manifold body 22 includes four side portions that include inwardly facing surfaces 23, 25, 27, 29. The inwardly facing surface 23, 25, 27, 29 along with an upper surface of the bottom plate 26 define a cavity 24 therein. The manifold 20 further includes a plurality of coupling recesses 28 formed around a top surface of the manifold body 22 that are utilized to couple the comb insert 30 to the manifold 20. The manifold 20 may be comprised of lightweight materials such as low-weight metals.

Figures 4A, 4B:
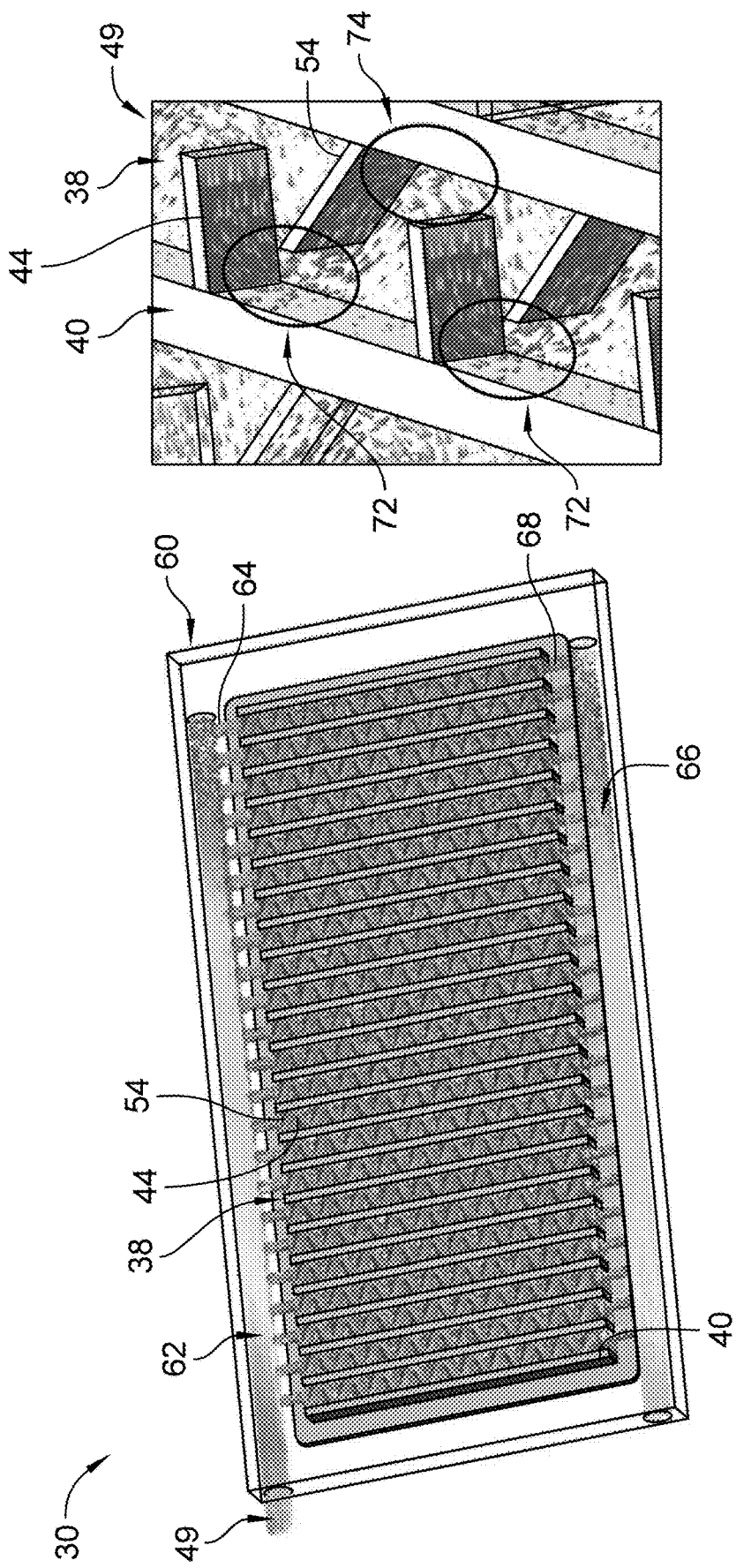
FIG. 4A is a perspective view of the comb insert, manifold, and vane plates of FIG. 3, showing that the manifold includes multiple cooling passages through which the fluid flows, and showing that the fluid flows from the cooling passages, into the channels and around the vanes of the comb insert, and exits into a cooling channel on the opposing side of the manifold.
FIG. 4B is a perspective view of a section of a cooling channel of FIG. 4A, showing that the fluid flows along a channel vane wall and directly against the opposing wall of the channel at a high angle, and then turns and flows along the next channel vane wall and directly against the opposing wall of that channel at a high angle, thus causing increased heat transfer to the fluid.

The manifold 20 further includes cooling passages 62, 66 that extend through two of the side portions of the manifold body 22 as shown in greater detail in FIG. 4A. The cooling passages 62, 66 open into the cavity 24 via a plurality of outlets 64, 68 that may be formed as small pipes extending out of the cooling passages 62, 66. The plurality of channels 38 formed in the comb insert 30 are each aligned with a pair of opposing outlets 64, 68 in order to receive the fluid 49. Specifically, the fluid 49 may be configured to flow through a first cooling passage 62 and out of the plurality of first outlets 64, through the channels 38 in the comb insert 30, and outwardly through the plurality of second outlets 68 and subsequently through the second cooling passage 64.

Figure 3:
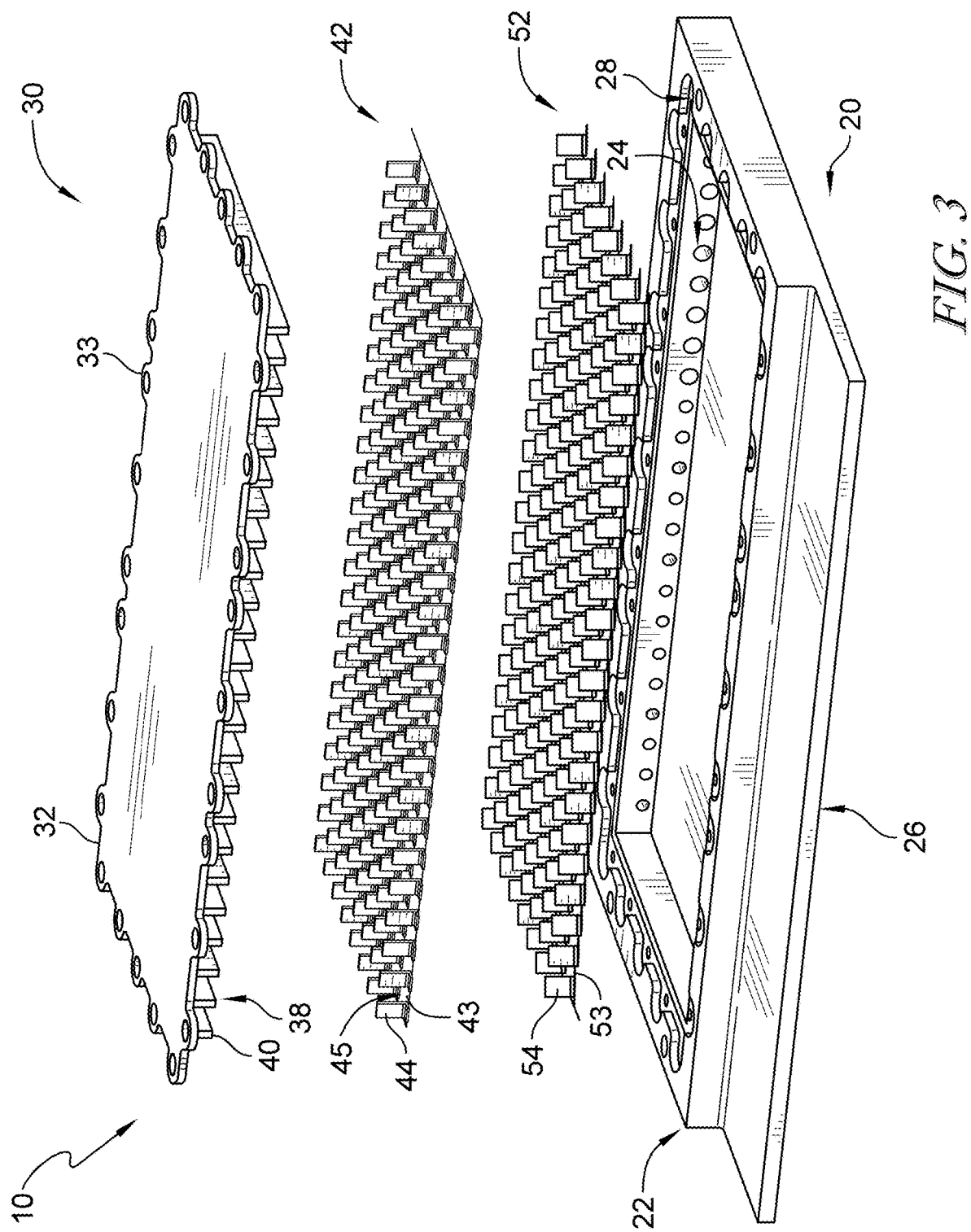
FIG. 3 is a perspective view of the comb insert and the manifold of the cold plate assembly of FIG. 2A, showing that the plurality of first channel vanes and the plurality of second channel vanes are formed on first and second vane plates, and showing that the first and second vane plates are stacked on each other such that the channel vanes of the bottom vane plate protrude through the upper vane plate and align with the channel vanes of the upper vane plate to form the flow path of the fluid within the channels of the comb insert.

In the illustrative embodiment, the comb insert 30 is located in the cavity 24 of the manifold 20, as shown in FIGS. 2A and 3. The comb insert includes a base panel 32 that is formed as a rectangular shape similarly to the manifold body 22 but sized to fit almost entirely within the cavity 24. The base panel 32 is generally planar and includes four sides 34, 35, 36, 37, each side including a plurality of coupling protrusions 33 formed as partial discs that extend away from the four sides 34, 35, 36, 37 of the base panel 32. The coupling protrusions 33 are arranged in corresponding coupling recesses 28 formed in the top surface of the manifold body 22 so as to couple the comb insert 30 to the manifold 20. The coupling protrusions 33 may include throughholes therein for fasteners to be inserted for coupling to the manifold 20.

The comb insert 30 includes a plurality of channels 38 for receiving the fluid 49 from the plurality of cooling passages 62, 66 and transferring heat to the fluid 49, as shown in greater detail in FIGS. 2B, 4A, and 4B. The comb walls 40 protrude away from the base panel 32 and extend across the base panel 32 from the first side 34 to the second side 37 of the base panel 32. In the illustrative embodiment, the walls 40 are perpendicular to the base panel 32. The walls 40 define the channels 38 therein. In the illustrative embodiment, the walls 40 are formed to all be parallel with each other, although the walls 40 may be formed nonparallel with each other based on design requirements of the assembly. The comb insert 30 may include 23 channels, as shown in FIGS. 2A and 3, although other numbers of channels may be utilized.

The comb insert 30 may be formed of a material or materials having high thermal conductivity in order to effectively transfer heat from the electrical component to the walls 40 of the comb insert 30, and thus the fluid 49 flowing through the channels 38. In the illustrative embodiment, the comb insert 30 is formed via an extrusion process, although other manufacturing processes may be utilized.

The cold plate assembly 10 further includes a first vaned plate 42 including a first panel 43 and a plurality of first channel vanes 44 extending away from the first panel 43, as shown in FIGS. 2A-4B, and in greater detail in FIG. 3. The first vaned plate 42 is removably coupled with the comb insert 30 under the walls 40 so as to locate the walls 40 between the first panel 43 and the base panel 32. The plurality of first channel vanes 44 extend upwardly away from the first panel 43 so as to locate the vanes 44 within the plurality of channels 38 formed in the comb insert 30. The vanes 44 are angled relative to the walls 40 and guide the fluid 49 flowing through the channels 38. The first vaned plate 42 may include the same number of rows of vanes 44 as the comb insert 30 has channels 38. In the illustrative embodiment, the first vaned plate 42 includes 23 rows of vanes 44.

Each first channel vane 44 extends from a first wall 40 of the plurality of comb walls 40 toward a second wall 40 directly neighboring the first wall 40, as shown clearly in FIGS. 2B and 4B. Specifically, each vane 44 extends away from the first wall 40 at a first angle 46 to direct the fluid to impinge upon the second, neighboring wall 40 with increased velocity so as to increase the heat transfer between the second wall 40 and the fluid 49. The vanes 44 are angled so as to also extend toward the second side 37 of the comb insert 30, as shown in FIG. 2B. In other embodiments, the vanes 44 may have differing angles, so long as the fluid 49 is generally directed at the neighboring second wall 40 at a high angle. For example, the first angle 46 may be in a range of 45 degrees to 85 degrees. In the illustrative embodiment, all first channel vanes 44 extend away from the first wall 40 at a first angle 46 of approximately 70 degrees. Varying angles may be utilized to affect different heat transfer and cooling rates in specific areas of the comb insert 30.

Each first channel vane 44 extends from a base end 47 contacting the first wall 40 to a terminal end 48 opposite the base end 47 as shown in FIG. 2B. The terminal end 48 is spaced apart from the second wall 40 so as to allow the fluid 49 to flow between the terminal end 48 and the second wall 40.

The cold plate assembly 10 further includes a second vaned plate 52 including a second panel 53 and a plurality of second channel vanes 54 extending away from the first panel 53, as shown in FIGS. 2A-4B, and in greater detail in FIG. 3. The second vaned plate 52 is removably coupled with the comb insert 30 under the walls 40 so as to locate the walls 40 between the second panel 53 and the base panel 32. Specifically, the second panel 53 is arranged on an underside surface of the first panel 43 of the first vaned plate 42. The first vaned plate 43 includes a plurality of openings 45 through which the second channel vanes 54 extend such that the first channel vanes 44 and the second channel vanes 54 are all arranged within the plurality of channels 38. The vanes 44, 54 extend entirely from the panels 43, 53 to the base panel 32.

The plurality of second channel vanes 54 extend upwardly away from the second panel 53 so as to locate the vanes 54 within the plurality of channels 38 formed in the comb insert 30. The vanes 54 are angled relative to the walls 40 and aid in guiding the fluid 49 flowing through the channels 38 along with the vanes 44. The second vaned plate 52 may include the same number of rows of vanes 54 as the comb insert 30 has channels 38. In the illustrative embodiment, the second vaned plate 52 includes 23 rows of vanes 54.

Each second channel vane 54 extends from the second wall 40 of the plurality of comb walls 40 toward the first wall 40 directly neighboring the second wall 40, as shown clearly in FIGS. 2B and 4B. Specifically, each vane 54 extends away from the second wall 40 at a second angle 56 to direct the fluid to impinge upon the first wall 40 with increased velocity so as to increase the heat transfer between the first wall 40 and the fluid 49. The vanes 54 are angled so as to also extend toward the second side 37 of the comb insert 30, as shown in FIG. 2B. In the illustrative embodiment, the second angle 56 is equal to the first angle 46, and all second vanes 54 extend away from the second wall 40 at the same angle. In other embodiments, the vanes 54 may have differing angles between themselves or differing angles from the first angle 46, so long as the fluid 49 is generally directed at the first wall 40 at a high angle. For example, the second angle 56 may be in a range of 45 degrees to 85 degrees. In the illustrative embodiment, all second channel vanes 54 extend away from the second wall 40 at a second angle 56 of approximately 70 degrees. Varying angles may be utilized to affect different heat transfer and cooling rates in specific areas of the comb insert 30.

Each second channel vane 54 extends from a base end 57 contacting the second wall 40 to a terminal end 58 opposite the base end 57 as shown in FIG. 2B. The terminal end 58 is spaced apart from the first wall 40 so as to allow the fluid 49 to flow between the terminal end 58 and the first wall 40.

As such, because of the spacing between the second wall 40 and the terminal end 47 of each first vane 44, and the spacing between the first wall 40 and the terminal end 57 of each second vane 54, the fluid 49 flows in a zigzag pattern through the channel 38 and impinges on the walls 40 after having flowed over and away from a vane 44, 54 in the impingement areas 72, 74 shown in FIG. 4B.

Since the impingement areas 72, 74 have highly effective convective heat transfer, the vanes 44, 54 themselves may not be required to participate in the heat transfer but only serve for flow-guiding purposes. As such, the vanes 44, 54 are not required to be manufactured to be optimized for heat transfer from coolant flow-over. In other words, there does not have to be effective thermal conductance between the vanes 44, 54 and the comb insert 30.

Figure 5:
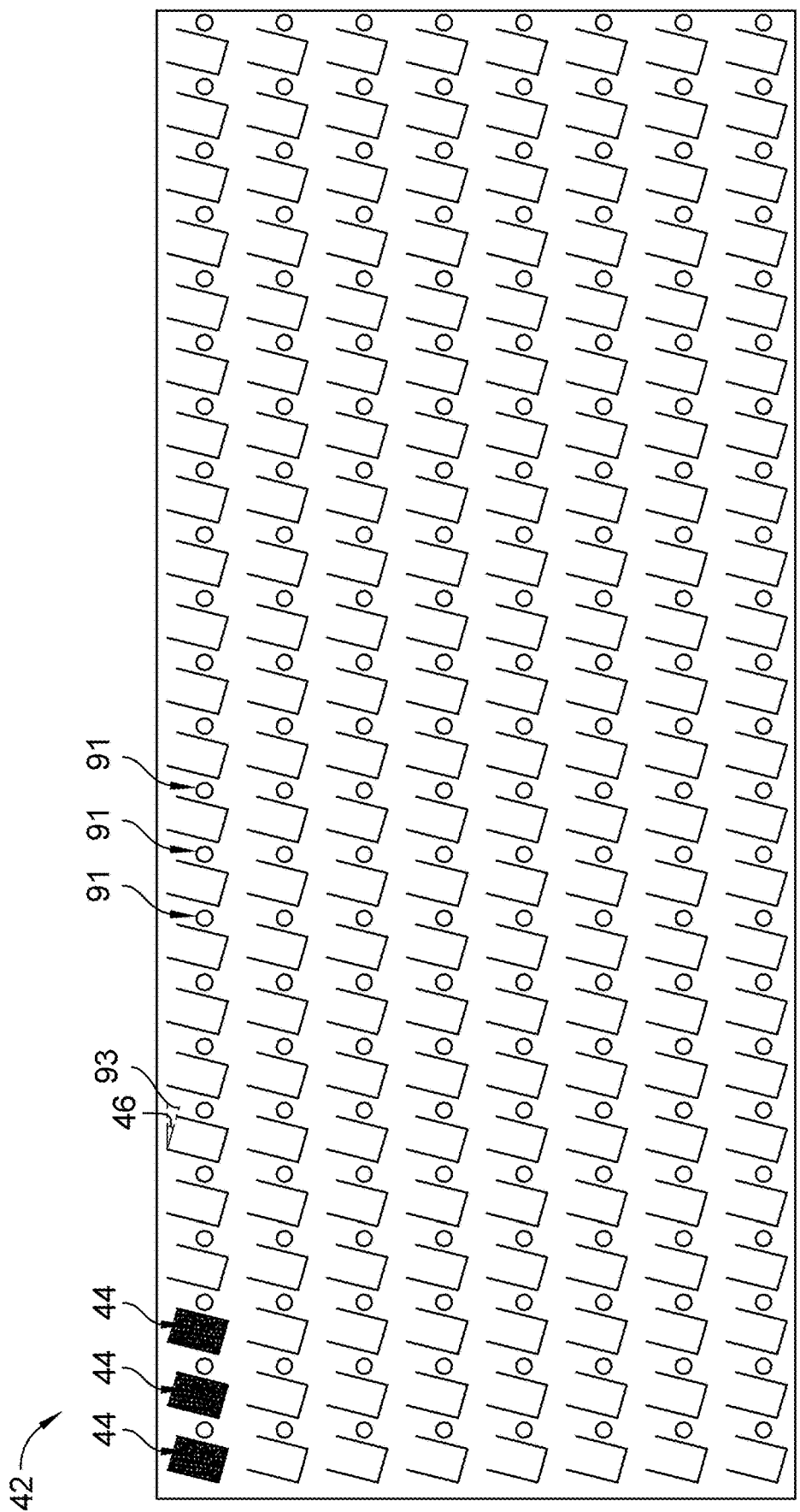
FIG. 5 is a top view of the first vane plate of FIG. 3 before the plurality of first channel vanes have been popped out of the plate via a presser, showing that the first vane plate further includes alignment holes for alignment during the pressing process.
Figure 6:
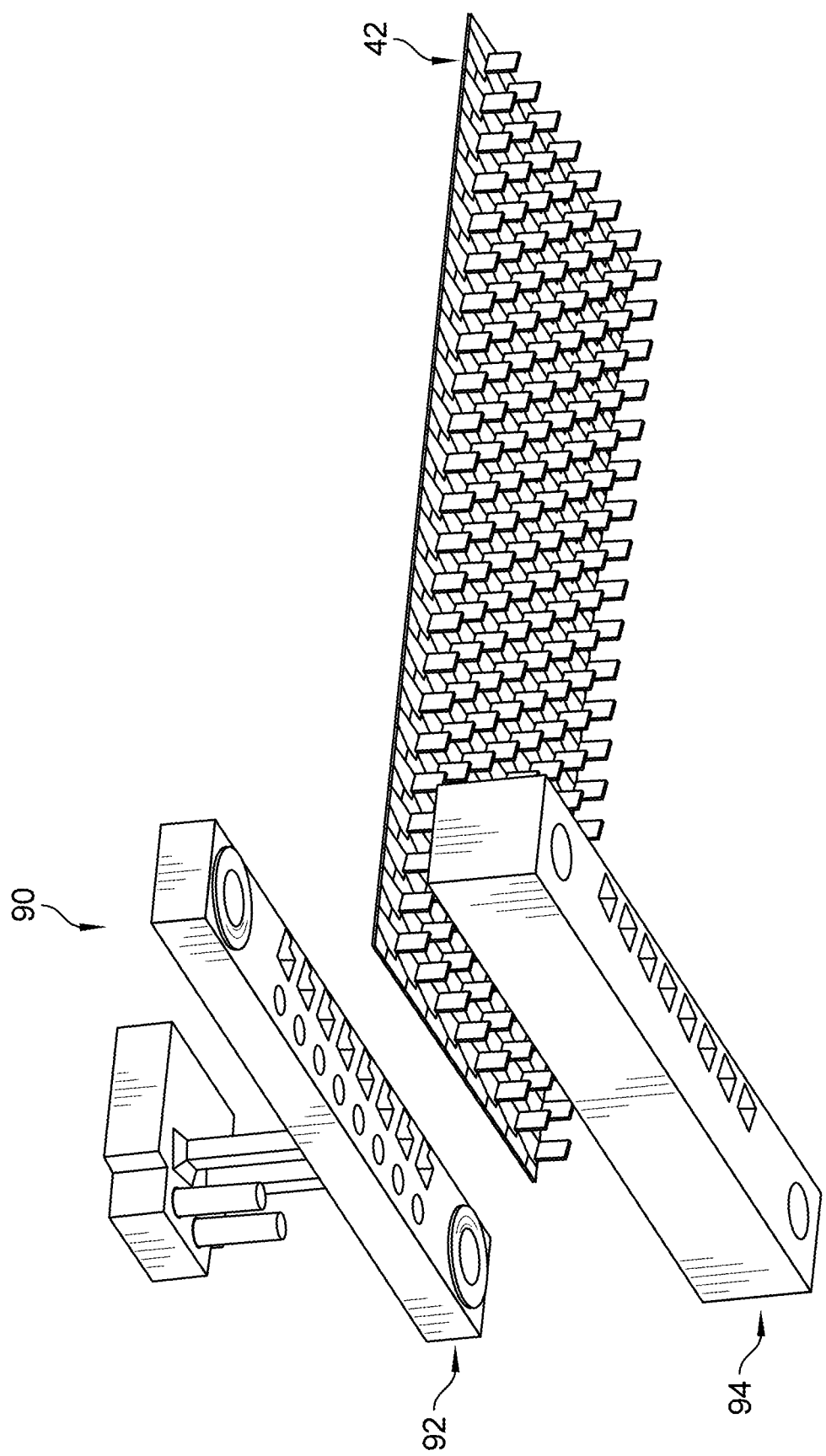
FIG. 6 is a perspective view of a pressing machine assembly utilized to press each channel vane of the first and second vane plates into the position shown in FIG. 3, showing that the assembly includes a press, an indenter, and a press die.

The first and second vane plates 42, 52 may be formed via planar cutting techniques and pressing. For example, as shown in FIGS. 5 and 6, the vane plates 42, 52 are formed a flat plates, or panels 43, 53, with the vanes 44, 54 outlined on the surface of the plate. As shown in FIG. 5, the first vane plate 42 includes a plurality of vanes 44 outlined on the panel 43, as well as alignment holes 91. Three sides of each vane 44 may be laser cut such that the vanes 44 may later be folded upwardly away from the panel 43 along fold lines 93 to form the vane plate 42 shown in FIG. 3.

The vane plate 42 is then placed in a press 90 including an indenter 92 and a press die 94 as shown in FIG. 6. The indenter 92 includes protrusions arranged to align with the vanes 44 of the vane plate 42. To create the vane plate 42 shown in FIG. 3, the indenter 92 is moved downwardly toward the press die 94, and each of the vanes 44 of a single row of vanes is pressed away from the panel 43, thus creating an upwardly extending row of vanes 44. The vane-pressing procedure can proceed row by row as shown in FIG. 6, where the alignment provisions can ensure high accuracy of the pressed vanes. The same procedures may be carried out to produce the second vane plate 52.

Figure 7A:
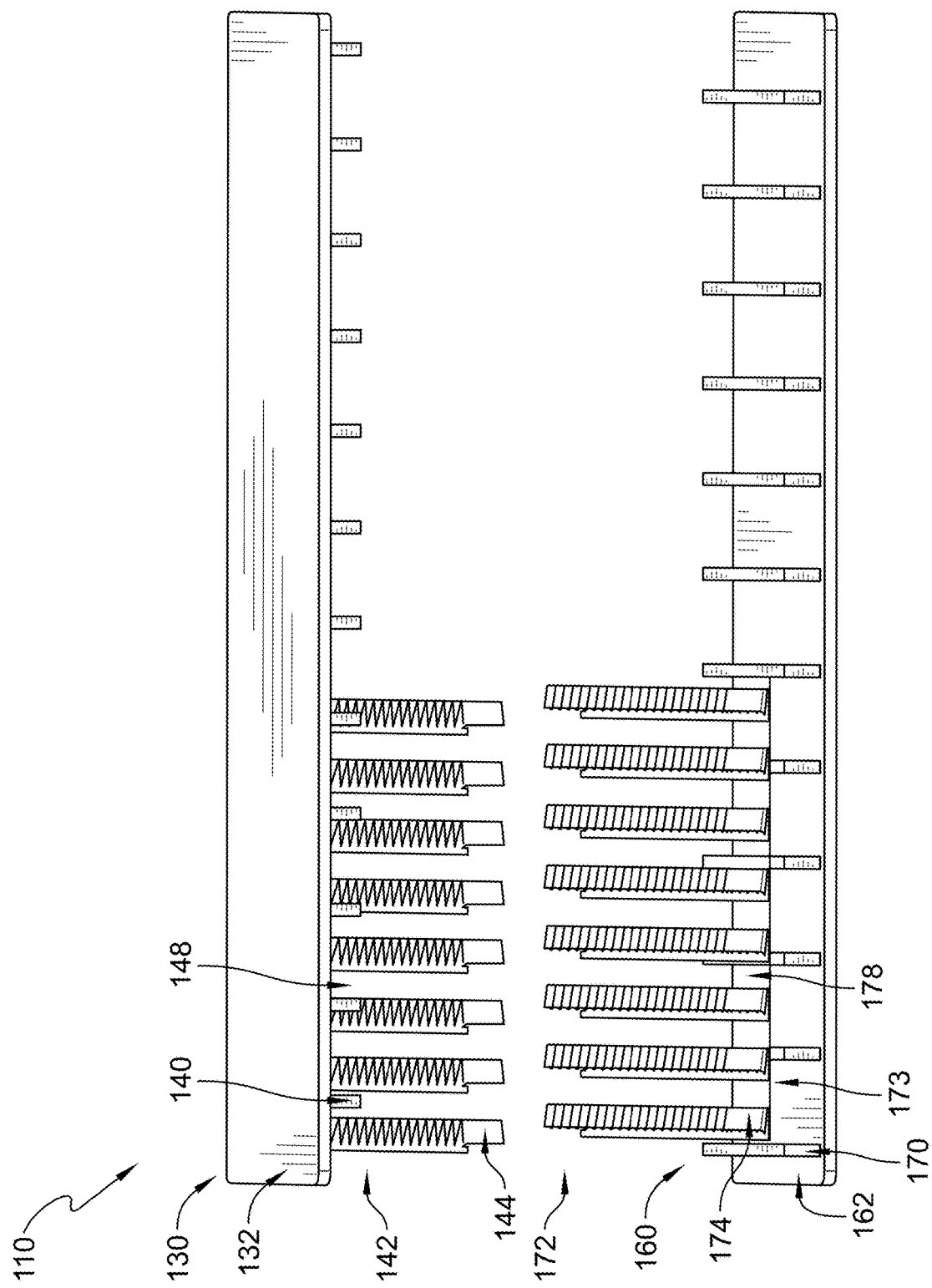
FIG. 7A is a front perspective view of a cold plate assembly according to an additional aspect of the present disclosure, showing that the cold plate assembly includes a first comb insert and a second comb insert, and further includes first and second vane plates having pluralities of vanes disposed in the channels, and showing that the walls of the first and second comb inserts face each other and are configured to be interdigitated.
Figure 7B:
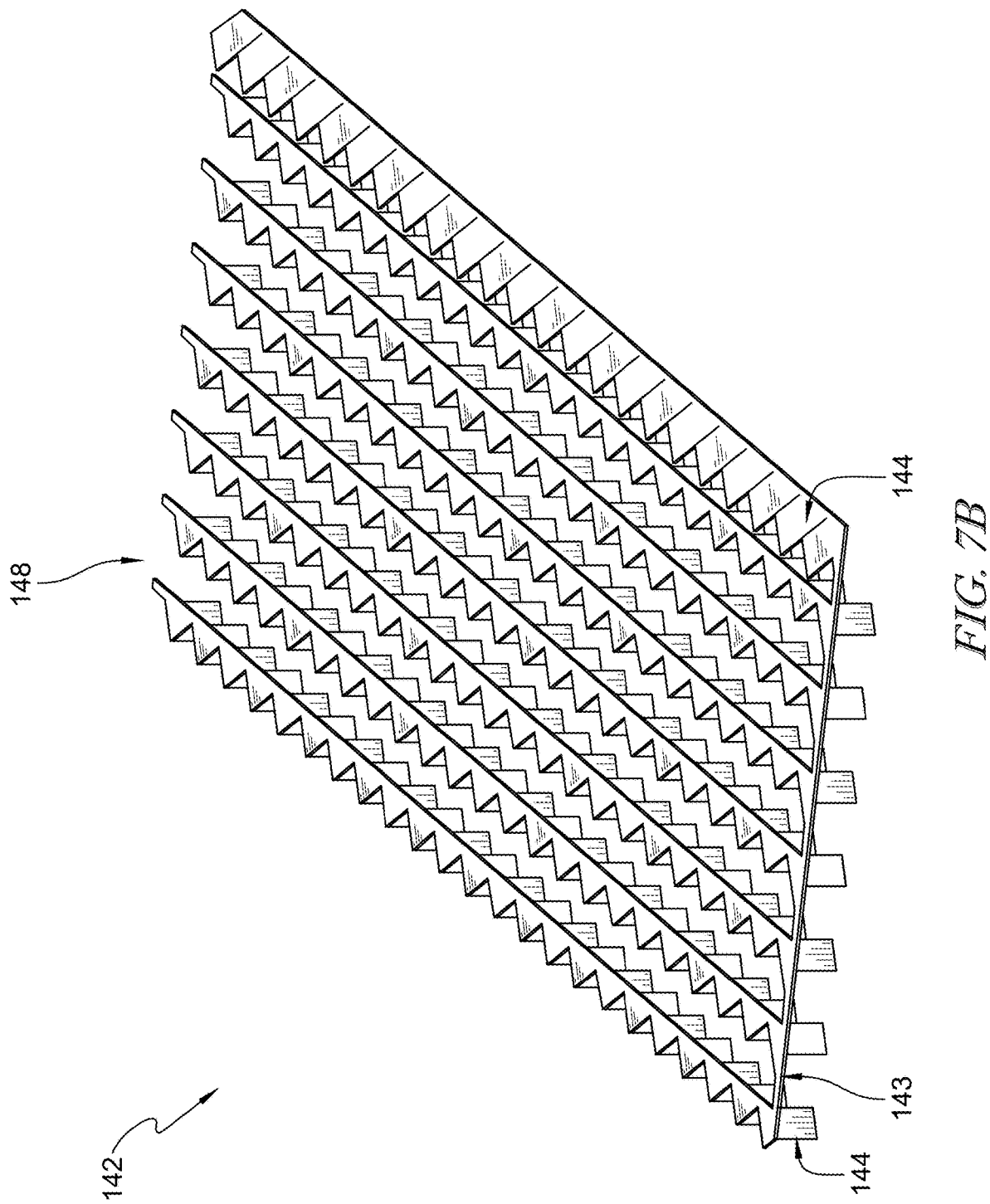
Figure 7C:
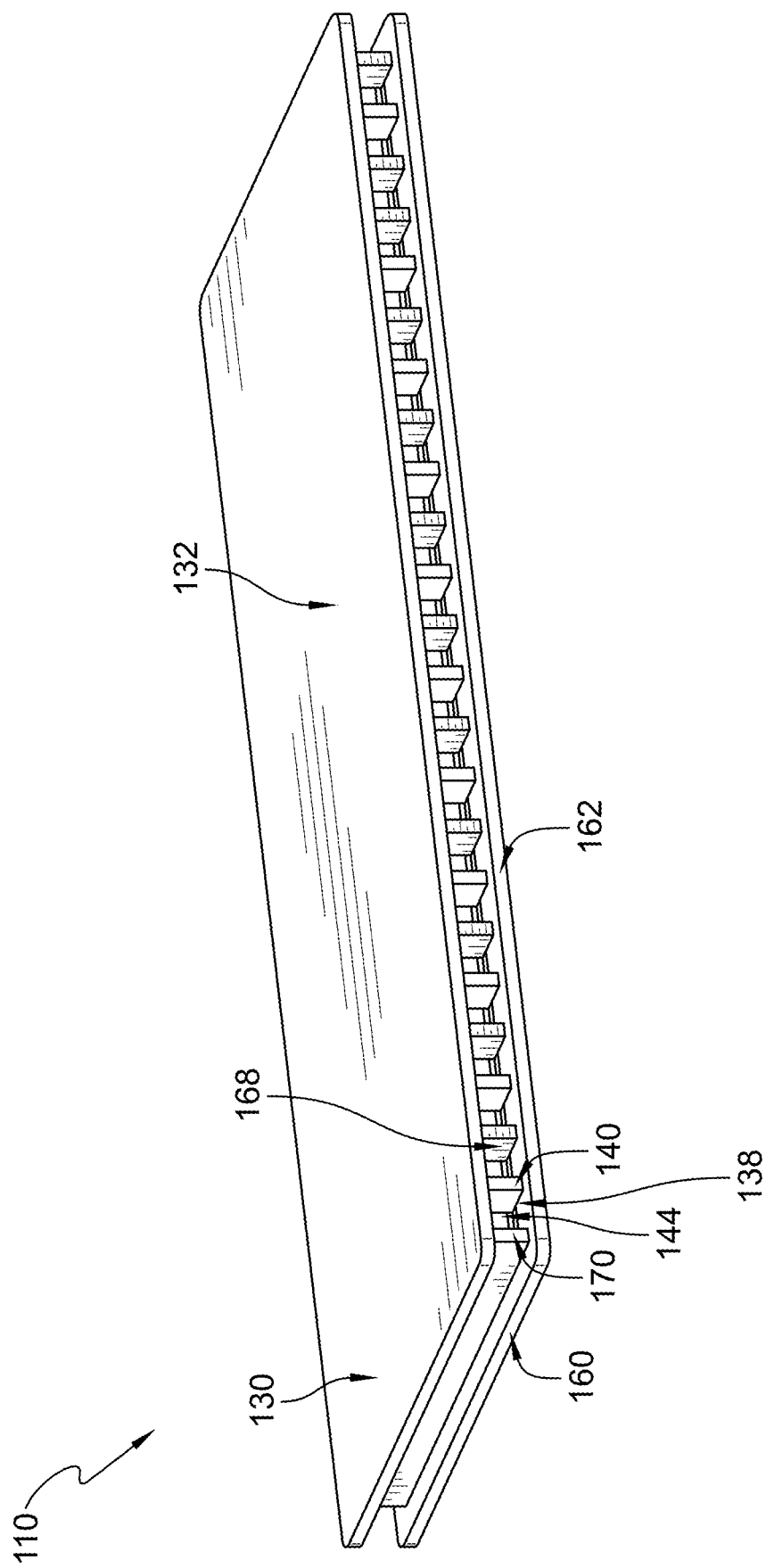
FIG. 7C is a perspective view of the cold plate assembly of FIG. 7A, showing that the vanes of the plates are arranged in the channels formed between interdigitated walls of the comb inserts.

Another embodiment of a cold plate assembly 110 in accordance with the present disclosure is shown in FIGS. 7A-7C. The cold plate assembly 110 is substantially similar to the cold plate assembly 10 described herein. Accordingly, similar reference numbers in the 100 series indicate features that are common between the cold plate assembly 110 and the cold plate assembly 10. The description of the cold plate assembly 10 is incorporated by reference to apply to the cold plate assembly 110, except in instances when it conflicts with the specific description and the drawings of the cold plate assembly 110.

Two comb inserts 130, 160 that may be utilized in the cold plate assembly 110 is shown in FIGS. 7A and 7C. The comb inserts 130, 160 each include a base panel 132, 162 and walls 140, 170. The base panels 132, 162 and walls 140, 170 are formed substantially similarly to the walls 40 described above. As shown in FIG. 7C, the lower comb insert 160 is arranged relative to the upper comb insert 130 such that the tops of the walls 170 extend upwardly and in between two walls 140 and contact or nearly contact the surface of the base panel 132. Similarly, the tops of the walls 140 extend downwardly and in between two walls 170 and contact or nearly contact the surface of the base panel 162. As such, the interdigitated walls 140, 170 form the channels 138, 168 between them.

The cold plate assembly 110 includes first and second vane plates 142, 172 having first and second channel vanes 144, 174 extending therefrom. Each vane plate 142, 172 includes a substantially planar panel 143, 173 from which the vanes 144, 174 extend. As described above, during the manufacturing process, the vanes 144, 174 are formed on the panel 143, 173 and are then folded outwardly so as to be perpendicular to the panel 143, 173. Unlike the vane plates 42, 52 described above, in particular the plates 42, 52 shown in FIG. 5, the vane panels 143, 173 of the present embodiment are formed with openings 148, 178 between rows of vanes 144, 174 within which the walls 140, 170 are arranged when the two inserts 130, 160 are assembled as shown in FIG. 7C. The openings 148, 178 allow for the interdigitated arrangement of the walls 140, 170. An example of the opening 148 is shown in detail for the plate 142 in FIG. 7B.

Each channel 138, 168 includes a row of vanes 144, 174 arranged therein. As can be seen in FIG. 7A, each open space between the walls 170 includes two rows of vanes 174, and similarly, each open space between walls 140 includes two rows of vanes 144. As such, the walls 140, 170 in the interdigitated arrangement divide each of these two rows of vanes 144, 174 into single rows disposed within respective channels 138, 168. For example, in the far left area of the cold plate assembly 110, the wall 140 of the upper comb insert 130 would fit between the two rows of vanes 174 in the far left space between the two leftmost walls 170 of the insert 160.

Figure 8:
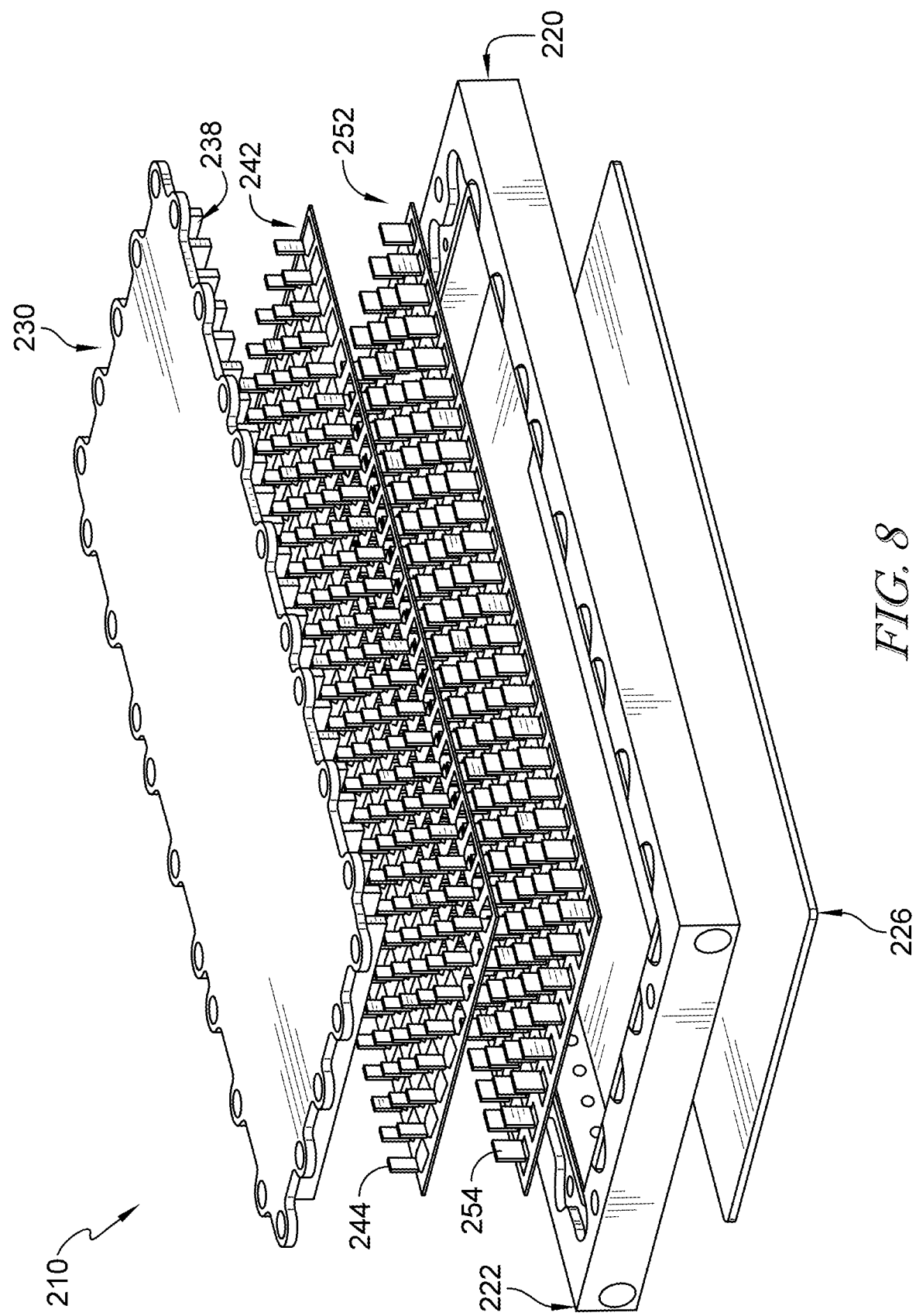
FIG. 8 is a perspective view of a cold plate assembly according to an additional aspect of the present disclosure showing a manifold, a comb insert including a plurality of channels defined by a plurality of walls and a plurality of channel vanes arranged within the channels, and heat sources arranged on top of the manifold and enclosing the comb insert within, and showing that a bottom plate of the manifold is removable so as to provide access to the vaned plates and the comb insert.

Another embodiment of a cold plate assembly 210 in accordance with the present disclosure is shown in FIG. 8. The cold plate assembly 210 is substantially similar to the cold plate assemblies 10, 110 described herein. Accordingly, similar reference numbers in the 200 series indicate features that are common between the cold plate assembly 210 and the cold plate assemblies 10, 110. The descriptions of the cold plate assemblies 10, 110 are incorporated by reference to apply to the cold plate assembly 210, except in instances when it conflicts with the specific description and the drawings of the cold plate assembly 210.

The cold plate assembly 210 is formed substantially similarly to the cold plate assembly 10 described above, including a manifold 220 having a manifold body 222, a comb insert 230, and vane plates 242, 252 each having vanes 244, 254 as shown in FIG. 8. Unlike the cold plate assembly 10, the manifold 220 includes a removable bottom plate 226 that is removably coupled to an underside of the manifold body 222. Such a removable bottom plate 226 may improve ease of maintenance in cases of blocked channels. The bottom plate 226 will be exposed to the exterior of the electrical component, which may be a power converter. In case of a blockage occurring in the channels or the event that the vanes are damaged, the cold plate components, including the comb insert 230 and the vane plates 242, 252, can be serviced without opening the power converter or electric component. It will be appreciated that the removable bottom plate 226 may be utilized as the bottom plate 26 of the cold plate assembly 10, a bottom plate 126 utilized in the cold plate assembly 110, and the bottom plates of any other embodiment described herein.

Figure 9:
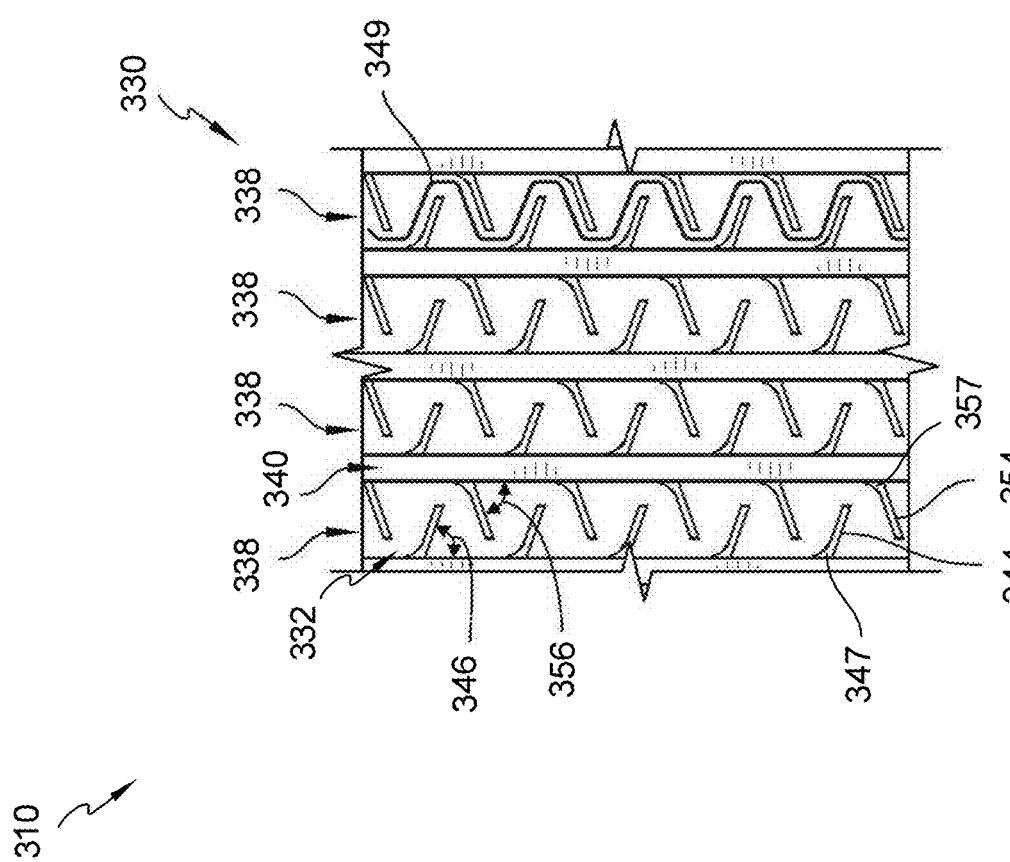
FIG. 9 is a top view of a section of a comb insert and vanes of a cold plate assembly according to an additional aspect of the present disclosure, showing that the first and second vanes have a curved portion on the base of the vane such the fluid flows along the curve after impinging on the wall at high velocity.

Another embodiment of a cold plate assembly 310 in accordance with the present disclosure is shown in FIG. 9. The cold plate assembly 310 is substantially similar to the cold plate assemblies 10, 110, 210 described herein. Accordingly, similar reference numbers in the 300 series indicate features that are common between the cold plate assembly 310 and the cold plate assemblies 10, 110, 210. The descriptions of the cold plate assemblies 10, 110, 210 are incorporated by reference to apply to the cold plate assembly 310, except in instances when it conflicts with the specific description and the drawings of the cold plate assembly 310.

A comb inserts 330 that may be utilized in the cold plate assembly 310 is shown in FIG. 9. The comb insert 330 includes a base panel 332 and walls 340 defining channels 338. The base panel 332 and walls 340 are formed substantially similarly to the walls 40 described above. The cold plate assembly 410 includes first and second vane plates 342, 352 having first and second channel vanes 344, 354 extending therefrom and arranged within the channels 338 to extend from the walls 340 at first and second angles 346, 356. The first and second vane plates 342, 352 are formed and arranged substantially similarly to the vane plates 42, 52 described above. However, unlike the vanes 44, 54 of the vane plates 42, 52, the vanes 344, 354 each include a curved portions 347, 457 on a side of the vanes 344, 354 facing opposite the direction of the fluid 349 flow. Thus, after the fluid 349 flows over the vane 344, 354 and impinges on the wall 340, the fluid then flows along the curved portion 347, 357 of the subsequent vane 344, 354, thus reducing turbulence and improving the smoothness of the fluid 349 flow.

A method includes forming a cavity within a manifold, forming a plurality of cooling passages within the manifold, the plurality of cooling passages opening into the cavity, and arranging a comb insert in the cavity of the manifold, the comb insert including a plurality of channels for receiving a fluid from the plurality of cooling passages and transferring heat to the fluid, the comb insert including a base panel and a plurality of comb walls protruding away from the base panel and extending from a first end of the base panel to a second end of the base panel opposite the first end to define the plurality of channels.

The method further includes removably coupling a first vaned plate with the comb insert such that a plurality of first channel vanes of the first vaned plate are located within the plurality of channels formed in the comb insert to guide the fluid through the plurality of channels, the first vaned plate including a first panel and the plurality of first channel vanes extending away from the first panel, each first channel vane of the plurality of first channel vanes extending from a first wall of the plurality of comb walls toward a second wall of the plurality of comb walls neighboring the first wall at a first angle to direct the fluid to impinge upon the second wall with increased velocity so as to increase the heat transfer between the second wall and the fluid.

The impingement flow created by the vanes 44, 54, 144, 154, 174, 184, 244, 254, 344, 354 within the channels 38, 138, 168, 238, 338 produces significantly higher convective heat transfer cooling performance than conventional cooling plate assemblies. Due to the higher cooling effectiveness, the impingement cooling requires much less contact area that the conventional methods. As such, the cold plate assemblies described herein produce compact cold plate designs with reduced weight and size compared to conventional cooling approaches.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A cold plate assembly for cooling an electronic device, the cold plate comprising
    a manifold formed to define a cavity therein and a plurality of cooling passages that extend through the manifold and open into the cavity,
    a comb insert located in the cavity of the manifold and formed to include a plurality of channels for receiving a fluid from the plurality of cooling passages and transferring heat to the fluid, the comb insert including a base panel and a plurality of comb walls protruding away from the base panel and extending from a first end of the base panel to a second end of the base panel opposite the first end to define the plurality of channels, and
    a first vaned plate including a first panel and a plurality of first channel vanes extending away from the first panel, the first vaned plate being removably coupled with the comb insert such that the plurality of first channel vanes are located within the plurality of channels formed in the comb insert to guide the fluid through the plurality of channels, and each first channel vane of the plurality of first channel vanes extend from a first wall of the plurality of comb walls toward a second wall of the plurality of comb walls neighboring the first wall at a first angle to direct the fluid to impinge upon the second wall with increased velocity so as to increase the heat transfer between the second wall and the fluid.

2. The cold plate assembly of claim 1, wherein each first channel vane of the plurality of first channel vanes extends from a base end contacting the first wall of the plurality of comb walls to a terminal end opposite the base end, and wherein the terminal end is spaced apart from the second wall of the plurality of comb walls so as to allow the fluid to flow between the terminal end and the second wall.

3. The cold plate assembly of claim 2, further comprising:
    a second vaned plate including a second panel and a plurality of second channel vanes extending away from the second panel, the second vaned plate being removably coupled with the comb insert such that the plurality of second channel vanes are located within the plurality of channels formed in the comb insert to guide the fluid through the plurality of channels, and each second channel vane of the plurality of second channel vanes extend from the second wall of the plurality of comb walls toward the first wall of the plurality of comb walls at a second angle to direct the fluid to impinge upon the first wall with increased velocity so as to increase the heat transfer between the second wall and the fluid.

4. The cold plate assembly of claim 3, wherein each second channel of the plurality of second channel vanes extends from a base end contacting the second wall of the plurality of comb walls to a terminal end opposite the base end, and wherein the terminal end is spaced apart from the first wall of the plurality of comb walls so as to allow the fluid to flow between the terminal end and the first wall.

5. The cold plate assembly of claim 4, wherein the second panel of the second vane plate is arranged on an underside surface of the first panel of the first vane plate, wherein the first vane plate includes a plurality of openings through which the plurality of second channel vanes extend such that the plurality of first channel vanes and the plurality of second channel vanes are all arranged within the plurality of channels.

6. The cold plate assembly of claim 4, wherein each first channel vane and each second channel vane also extends from the first and second walls, respectively, toward the second end of the base panel, and wherein the first angle and the second angle are in a range of 45 degrees to 85 degrees.

7. The cold plate assembly of claim 6, wherein the first angle is equal to the second angle.

8. The cold plate assembly of claim 4, wherein the plurality of cooling passages open into the cavity via a plurality of outlets, and wherein the plurality of channels are each aligned with an outlet of the plurality of outlets in order to receive the fluid.

9. The cold plate assembly of claim 4, wherein the manifold includes a manifold body and a bottom plate, wherein the cavity of the manifold is defined by four side walls of the manifold body and a top surface of the bottom plate, and wherein the bottom plate is removably coupled to an underside of the manifold body and is configured to be removed from the manifold body so as to provide access to the first vaned plate, the second vaned plate, and the comb insert.

10. The cold plate assembly of claim 9, wherein the comb insert includes a plurality of coupling protrusions extending away from a perimeter of the base panel, and wherein the plurality of coupling protrusions are arranged in corresponding coupling recesses formed in a top surface of the manifold body so as to couple the comb insert to the manifold.

11. The cold plate assembly of claim 4, further comprising:
a second comb insert located in the cavity of the manifold and formed to include a plurality of second channels for receiving a fluid from the plurality of cooling passages and transferring heat to the fluid, the second comb insert including a second base panel and a plurality of second comb walls protruding away from the base panel and extending from a first end of the second base panel to a second end of the second base panel opposite the first end to define the plurality of second channels; and
a third vaned plate including a third panel and a plurality of third channel vanes extending away from the third panel, the third vaned plate being removably coupled with the second comb insert such that the plurality of third channel vanes are located within the plurality of second channels formed in the second comb insert to guide the fluid through the plurality of second channels, and each third channel vane of the plurality of third channel vanes extends from a third wall of the plurality of second comb walls toward a fourth wall of the plurality of second comb walls neighboring the first wall at a third angle to direct the fluid to impinge upon the fourth wall with increased velocity so as to increase the heat transfer between the fourth wall and the fluid.

12. The cold plate assembly of claim 11, further comprising:
a fourth vaned plate including a fourth panel and a plurality of fourth channel vanes extending away from the fourth panel, the fourth vaned plate being removably coupled with the second comb insert such that the plurality of fourth channel vanes are located within the plurality of second channels formed in the second comb insert to guide the fluid through the plurality of second channels, and each fourth channel vane of the plurality of fourth channel vanes extends from the fourth wall of the plurality of second comb walls toward the third wall of the plurality of second comb walls at a fourth angle to direct the fluid to impinge upon the third wall with increased velocity so as to increase the heat transfer between the third wall and the fluid.

13. A cold plate assembly for cooling an electronic device, the cold plate comprising
a manifold formed to define a cavity therein,
a comb insert located in the cavity of the manifold and formed to include a plurality of channels for receiving a fluid, the comb insert including a plurality of comb walls defining the plurality of channels, and
a first vaned plate including a first panel and a plurality of first channel vanes extending away from the first panel, the plurality of first channel vanes are located within the plurality of channels formed in the comb insert to guide the fluid through the plurality of channels, and each first channel vane of the plurality of first channel vanes extend from a first wall of the plurality of comb walls toward a second wall of the plurality of comb walls neighboring the first wall at a first angle to direct the fluid to impinge upon the second wall with increased velocity so as to increase the heat transfer between the second wall and the fluid.

14. The cold plate assembly of claim 13, wherein the first vaned plate is removably coupled with the comb insert.

15. The cold plate assembly of claim 14, further comprising:
a second vaned plate including a second panel and a plurality of second channel vanes extending away from the second panel, the second vaned plate being removably coupled with the comb insert such that the plurality of second channel vanes are located within the plurality of channels formed in the comb insert to guide the fluid through the plurality of channels, and each second channel vane of the plurality of second channel vanes extend from the second wall of the plurality of comb walls toward the first wall of the plurality of comb walls at a second angle to direct the fluid to impinge upon the first wall with increased velocity so as to increase the heat transfer between the second wall and the fluid.

16. The cold plate assembly of claim 15, wherein each first channel vane of the plurality of first channel vanes extend from a base end contacting the first wall of the plurality of comb walls to a terminal end opposite the base end, and wherein the terminal end is spaced apart from the second wall of the plurality of comb walls so as to allow the fluid to flow between the terminal end and the second wall.

17. The cold plate assembly of claim 16, wherein each second channel vane of the plurality of second channel vanes extend from a base end contacting the second wall of the plurality of comb walls to a terminal end opposite the base end, and wherein the terminal end is spaced apart from the first wall of the plurality of comb walls so as to allow the fluid to flow between the terminal end and the first wall.

18. The cold plate assembly of claim 17, wherein the first angle is equal to the second angle.

19. The cold plate assembly of claim 14, wherein the manifold includes a plurality of cooling passages extending through the manifold and open into the cavity, wherein the plurality of channels of the comb insert receive the fluid from the plurality of cooling passages and transfer heat to the fluid, wherein the manifold includes a manifold body and a bottom plate, wherein the cavity of the manifold is defined by four side walls of the manifold body and a top surface of the bottom plate, and wherein the bottom plate is removably coupled to an underside of the manifold body and is configured to be removed from the manifold body so as to provide access to the first vaned plate and the comb insert.

20. A method comprising
forming a cavity within a manifold,
forming a plurality of cooling passages within the manifold, the plurality of cooling passages opening into the cavity,
arranging a comb insert in the cavity of the manifold, the comb insert including a plurality of channels for receiving a fluid from the plurality of cooling passages and transferring heat to the fluid, the comb insert including a base panel and a plurality of comb walls protruding away from the base panel and extending from a first end of the base panel to a second end of the base panel opposite the first end to define the plurality of channels, and removably coupling a first vaned plate with the comb insert such that a plurality of first channel vanes of the first vaned plate are located within the plurality of channels formed in the comb insert to guide the fluid through the plurality of channels, the first vaned plate including a first panel and the plurality of first channel vanes extending away from the first panel, each first channel vane of the plurality of first channel vanes extending from a first wall of the plurality of comb walls toward a second wall of the plurality of comb walls neighboring the first wall at a first angle to direct the fluid to impinge upon the second wall with increased velocity so as to increase the heat transfer between the second wall and the fluid.

\* \* \* \* \*